GROUP III-V COMPOUND TRANSISTOR

Original Filed May 20, 1963 3 Sheets-Sheet 1

Inventors:
DORIS W. FLATLEY,
HANS W. BECKE &
DANIEL STOLNITZ

By

Attorney

Inventors:
DORIS W FLATLEY,
HANS W. BECKE &
DANIEL STOLNITZ
[signature]
Attorney Inventors:
DORIS W. FLATLEY,
HANS W. BECKE &
DANIEL STOLNITZ
By [signature]
Attorney

United States Patent Office 3,321,682
Patented May 23, 1967

3,321,682
GROUP III–V COMPOUND TRANSISTOR

Doris W. Flatley, Trenton, Hans W. Becke, Morristown, and Daniel Stolnitz, Raritan, N.J., assignors to Radio Corporation of America, a corporation of Delaware Original application May 20, 1963, Ser. No. 281,559, now Patent No. 3,255,056. Divided and this application Apr. 14, 1966, Ser. No. 542,573
2 Claims. (Cl. 317—237)

Figure 1:
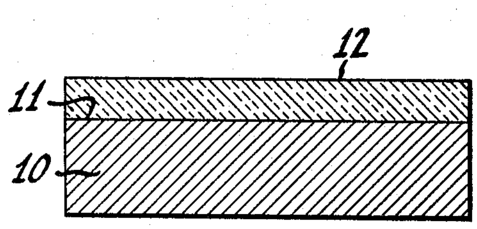

This application is a division of application Ser. No. 281,559, now Patent No. 3,255,056, filed May 20, 1963. This invention relates to improved semiconductor devices and improved methods of fabricating them.

It is known that in addition to the conventional elemental semiconductors such as germanium and silicon, certain crystalline compounds may also be utilized as semiconductors in the fabrication of junction devices. One such group of compounds consists of an element from Group III of the Periodic Table combined with an element from Group V of the Periodic Table, and are therefore known as the III–V compounds. Examples of such compound semiconductors are the phosphides, arsenides and antimonides of boron, aluminum, gallium and indium. For a detailed description of these semiconductive materials and their properties, see for example Willardson and Goering, "Compound Semiconductors," vol I, Preparation of III–V Compounds, Reinhold Publishing Co., New York, 1962. Some of these compounds, such as gallium phosphide, have an energy gap which is too high, and others, such as indium antimonide, have an energy gap which is too low for general device applications. The III–IV compounds regarded as most suitable for devices which include a rectifying barrier are indium phosphide and gallium arsenide.

The techniques described herein for fabricating transistors from the III–IV compounds result in an extremely narrow base region. Consequently, a large portion of charge carriers injected from the emitter region into the base of the transistor so fabricated survive long enough to diffuse through the base region and reach the base-collector junction. Another advanatge of these techniques is that the resulting transistors have a high ratio of conductivity of emitter region to conductivity of base region, for example, a ratio of about 20 to 1 at room temperature (that is, at about 20° C.) These advantages are evidenced by improved operating characteristics in such III–V transistors. However, the invention may also be employed in fabricating transistors other than those of the III–IV compound group.

Accordingly, it is an object of this invention to provide improved methods of fabricating improved semiconductor devices.

Anoher object is to provide improved semiconductor devices.

Still another object is to provide III–V compound transistors having a very thin base region.

But another object is to provide III–V compound transistors having a high ratio of emitter region conductivity to base region conductivity.

These and other objects and advantages are obtained by an improved combination of in-diffusion and out-diffusion techniques which provides a semiconductor device comprising a wafer of a crystalline semiconductive material such as III–V semiconductive compound. The compound is preferably selected from the group consisting of gallium arsenide and indium phosphide. The wafer includes a P-conductivity type region less than one micron thick. The P-type region has a net excess of zinc atoms over N-type impurities of less than $5 \times 10^{17}$ zinc atoms per $cm^3$.

Figure 15:
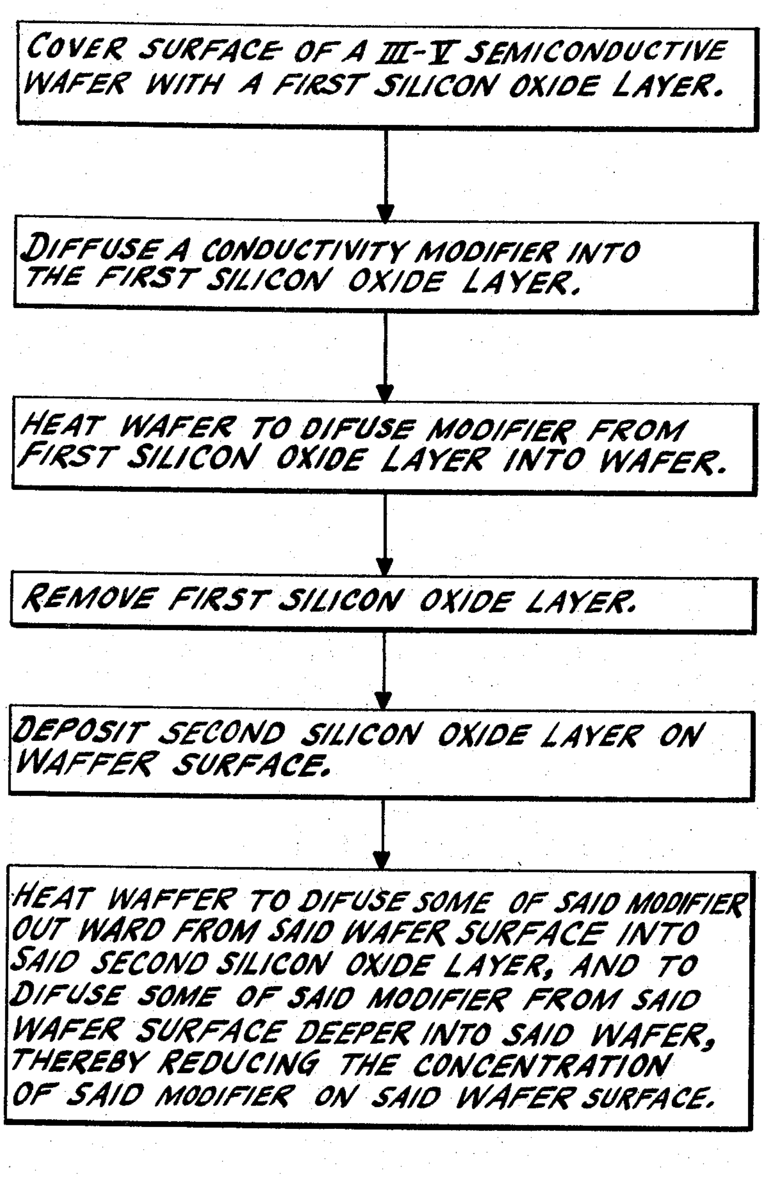

The invention will be described in greater detail by the following example, considered in conjunction with the accompanying drawing, in which:

FIGURES 1–14 are cross-sectional schematic views of a wafer during successive steps in the fabrication of a semiconductor device; and FIGURE 15 is a flow sheet of certain steps of one embodiment of a process of manufacture of a device, in accordance with the invention.

*Example*

A semiconductor wafer 10 (FIGURE 1) of one of the crystalline semiconductive III–V compounds is prepared with at least one major wafer face 11. The semiconductive material is preferably selected from the group consisting of indium phosphide and gallium arsenide. In this example, wafer 10 consists of monocrystalline gallium arsenide. The exact size and shape of wafer 10 is not critical. In this example, wafer 10 is about 40 mils square and 7 mils thick. The semiconductive wafer may be of either conductivity type, or intrinsic or compensated. In this example, wafer 10 is of N-type conductivity. A layer 12 of an insulating oxide such as silicon oxide, titanium oxide, and the like is now deposited on major wafer face 11 by any convenient method. In this example, insulating layer 12 consists of silicon oxide, and is deposited by thermally decomposing a siloxane compound, and passing the vaporized decomposition products of the siloxane compound over the wafer. The layer 12 is suitably about 1000 to 10,000 Angstroms thick.

Figure 2:
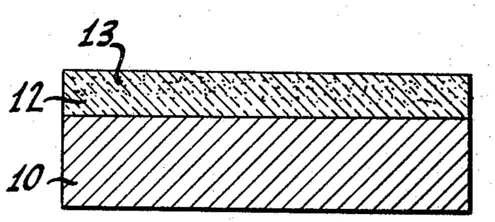

Referring now to FIGURE 2, a substance which is a conductivity modifier in III–V compounds is diffused into the silicon oxide layer 12 only. The extent and concentration of the modifier is indicated qualitatively by the dotted areas 13 in FIGURES 2–7. In FIGURES 8–15, the extent and concentration of the modifier is omitted for greater clarity, since it is the same as in FIGURE 7. In this example, the conductivity modifier is zinc. Wafer 10 is heated to about 725° C. in a non-oxidizing ambient such as argon in the presence of a source of zinc vapors for a period of time (about 4 minutes has been found suitable) sufficient to diffuse some of the conductivity modifier 13 (zinc in this example) into the silicon oxide layer 12. However, the temperature and time of this heating step are insufficient for the modifier to diffuse completely through the silicon oxide layer 12 and into the wafer 10. The modifier 13 thus remains concentrated in the uppermost portion of the first silicon oxide layer 12, that is, the portion which is not immediately adjacent wafer face 11.

Figure 3:
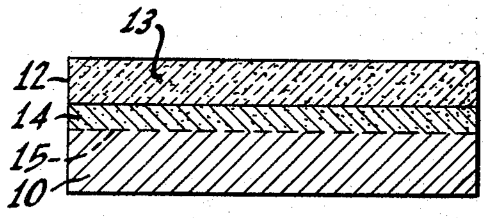

Referring now to FIGURE 3, wafer 10 is reheated in a non-oxidizing ambient which is free from any conductivity modifiers. The time and temperature of this heating step are selected so that the conductivity modifier in the silicon oxide layer 12 diffuses completely through the silicon oxide layer 12 and a short distance (only about 0.4 micron) into the wafer 10. In this example, wafer 10 is heated to about 800° C. for about 4 hours. The zinc diffused wafer region 14 is converted to P-type conductivity, and a rectifying barrier or PN junction 15 is formed between the P-type zinc diffused region 14 immediately adjacent the silicon oxide layer 12 and the N-type bulk of wafer 10.

Figure 4:
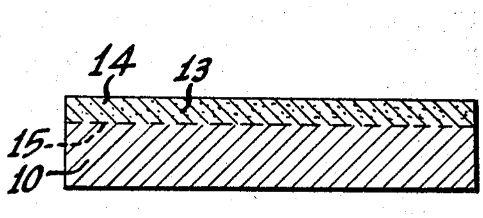

The first silicon oxide layer 12 is now removed, leaving the wafer 10 as illustrated in FIGURE 4. The silicon oxide layer 12 may be conveniently removed by etching in concentrated hydrofluoric acid, or in an etchant containing hydrofluoric acid.

Figure 5:
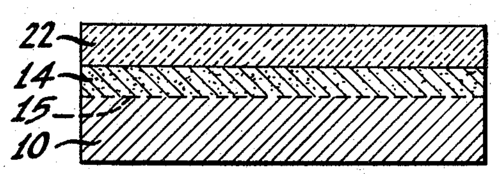

Referring now to FIGURE 5, a second silicon oxide layer 22 is deposited on face 11 of wafer 10. The second silicon oxide layer 22 may be deposited in the same manner as the first silicon oxide layer 12, or by any other convenient technique.

Figure 6:
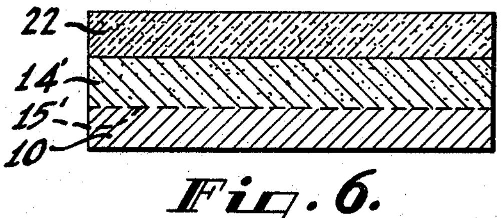
Figure 7:
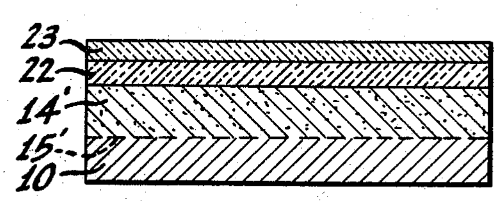
Figure 8:
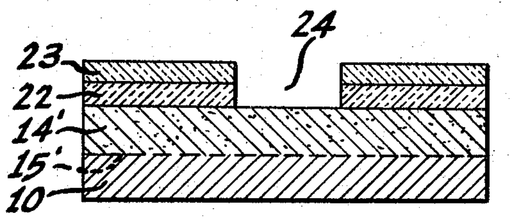

Wafer 10 is reheated in a non-oxidizing ambient. In this example, the gallium arsenide wafer 10 is reheated in argon at about 900° C. for about 24 hours. The effect of this heating step is to diffuse some of the conductivity modifier (zinc in this example) outward from region 14 into the second silicon oxide layer 22, as illustrated in FIGURE 6. At the same time, some of the conductivity modifier diffuses deeper into the wafer, thus making the P-type region in the wafer thicker. As a result of this combination of out-diffusion and in-diffusion, the concentration of the conductivity modifier in the P-type region is decreased, and in particular the concentration of the modifier on the surface 11 of wafer 10 is sharply decreased. The net excess of zinc atoms over N-type impurities at the surface of the wafer is thereby reduced to less than $5 \times 10^{17}$ zinc atoms per cm.$^3$. In this example, the thicker and less heavily doped P-type region of wafer 10 is denoted by reference numeral 14' in FIGURE 6. The PN junction that is formed is deeper into wafer 10 than the previous PN junction 15, as a result of this step, and is denoted by reference numeral 15' in FIGURE 6. Region 14' is only about 0.8 micron thick in this example.

Preselected portions of silicon oxide layer 22 are removed by any convenient method, such as photolithographic techniques, and the remainder of layer 22 is utilized as a diffusion mask. The silicon oxide layer 22 is coated with film 23 (FIGURE 7) of a photoresist, which may be a bichromated protein such as bichromated albumen, bichromated gum arabic, and the like. Commercially available photosensitive resists, such as KPR, manufactured by the Eastman Kodak Company; CFC; manufactured by the Clerkin Company; and Hot Top, manufactured by the Pitman Company, may also be utilized for this purpose.

The photoresist film 23 is suitably masked; the unmasked portions of the photoresist are exposed to light and thus polymerized and hardened; the unexposed portions of the photoresist are removed with a suitable organic solvent such as xylol and the like; and the portion of silicon oxide layer 22 thus exposed is removed by an etchant. An aperture 24 (FIGURE 8) which defines a portion, which may be a circular portion, of wafer face 11 is thereby formed in the silicon oxide layer 22.

Figure 9:
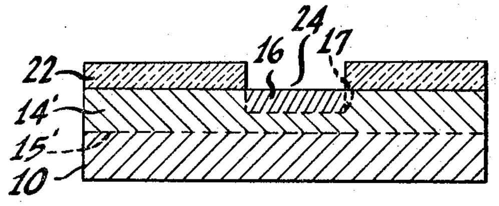

Referring now to FIGURE 9, the remaining portion of photoresist film 23 is removed by means of a suitable stripper such as methylene chloride or the like, and the wafer 10 is then heated in an ambient comprising a substance which is a conductivity modifier in III–V compounds. In this example, the conductivity modifier is tin. Tin is an N-type conductivity modifier in III–V compounds such as gallium arsenide. Since gallium arsenide tends to dissociate when heated and emit arsenic vapors, the wafer 10 is preferably heated in an ambient containing a vapor pressure of arsenic which is greater than the pressure of arsenic produced by the dissociation of gallium arsenide at the temperature utilized, thereby preventing the wafer from losing arsenic. In this example, wafer 10 is heated to about 950° C. for a period of about 10 to 60 minutes in an ambient containing sufficient arsenic vapors to exhibit a partial pressure of about 0.5 atmosphere. As a result of this diffusion step, sufficient tin diffuses into the exposed portion of wafer face 11 to form an N-type wafer region 16. Wafer region 16 is about 0.4 micron thick in this example, and is completely surrounded by the zinc-diffused P-type wafer region 14'. A rectifying barrier or PN junction 17 is formed at the interface between N-type wafer region 16 and P-type wafer region 14'.

Figure 10:
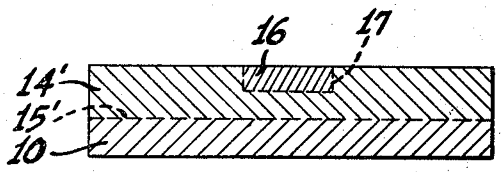
Figure 13:
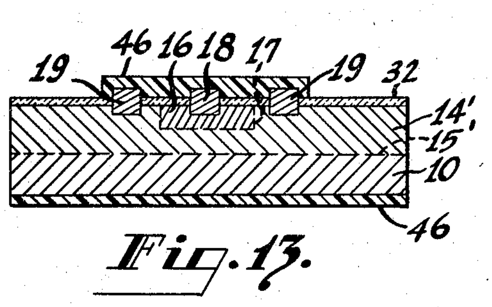
Figure 11:
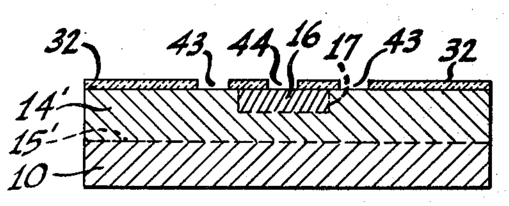
Figure 14:
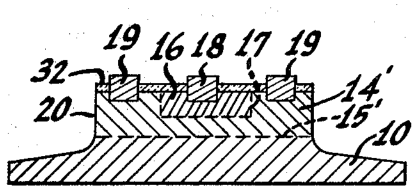

The remaining portions of silicon oxide layer 22 are now removed by lapping or grinding, or by means of a suitable etchant such as concentrated hydrofluoric acid, leaving wafer 10 with two rectifying barriers 15' and 17 as illustrated in FIGURE 10. A third silicon oxide layer 32 (FIGURE 11) is now deposited on wafer face 11. Utilizing the photolithographic techniques described above portions of silicon oxide layer 32 are removed, leaving a central aperture 44 completely within the tin-diffused region 16, and a surrounding annular aperture 43 which is completely within the zinc-diffused P-type region 14'.

Figure 12:
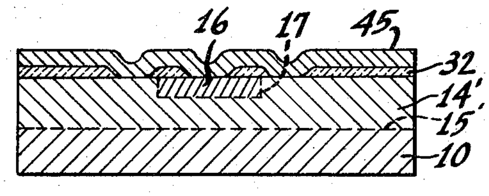

Referring now to FIGURE 12, a metallic film 45 is depositioned by any convenient method, such as evaporation, over the silicon oxide layer 32 and also over the exposed portions of wafer face 11 within apertures 43 and 44. The metallic film 45 may for example consist of silver, chromium, gold, or the like. The portions of metallic film 45 which are not on the wafer surface are then removed by conventional masking and etching techniques. Wafer 10 is heated in a non-oxidizing ambient such as hydrogen to alloy the remaining portions of film 45 to the wafer. A metallic contact 18 (FIGURE 13) is thus formed to N-type region 16, and another metallic contact to P-type region 14'. A central portion of wafer face 11 including electrodes 18 and 19 is then covered with a suitable resist 46, which may for example consist of paraffin wax or apiezon wax. The opposite major face of wafer 10 is similarly protected by the acid resist 46.

Wafer 10 is then immersed in a suitable etchant, so as to remove a surface portion of the wafer except for that part of the wafer masked by resist 46. A mesa 20 (FIGURE 14) is thus formed on the wafer. The wafer is removed from the etchant, washed, and the resist 46 removed by a suitable solvent. The remaining steps of attaching lead wires to contacts 18 and 19, and mounting and encapsulating the device, are accomplished by any of the suitable techniques known to the semiconductor art, and need not be described here. In operating the device as an NPN transistor, the region 16 serves as the emitter region, the region 14' serves as the base region, and the remainder of wafer 10 is the collector region.

In the devices fabricated according to the invention, the effective concentration of tin atoms (donor atoms) in the emitter region is about $1 \times 10^{19}$ tin atoms per cm.$^3$, while the concentration of zinc atoms (acceptor atoms) at the surface of the base region is less than $5 \times 10^{17}$ zinc atoms per cm.$^3$. A favorable ratio of emitter conductivity to base conductivity is thus obtained, which results in useful injection efficiency. Moreover, the thickness of the P-type base region 14' in the devices thus fabricated is not only much less than hitherto obtainable, being only about 0.4 micron thick between the emitter and collector regions, but is also very uniform and reproduceable, and therefore suitable for mass production. Gallium arsenide transistors fabricated in accordance with this example exhibited power gains of about 12 db at a frequency of 50 megacycles. It was also unexpectedly found that the electrical characteristics of the units thus fabricated remained surprisingly stable over the temperature range from 4° K., the temperature of liquid helium, to 570° K.

A preferred form of the invention has thus been described by way of illustration only, and not limitation. Other crystalline semiconductive materials may be utilized for the wafer. Other conductivity modifiers for III–V compounds, such as cadmium, selenium, tellurium, and the like, may be utilized. Although the device of the example was an NPN type transistor, the conductivity types of the various regions may be reversed, utilizing known acceptors and donors, so as to fabricate corresponding PNP type transistors. The shapes of the emitter and base contacts may be altered as desired, for example to form the emitter and base contacts in the shape of two closely adjacent rectangles, or with irregular outlines to increase the periphery of the contacts without increasing their total area. It will be understood that various changes and modifications may be made by those skilled in the art without departing from the spirit and scope of the invention as defined in the specification and the appended claims.

We claim:

1. A transistor comprising:

an N type crystalline semiconductive body having at least one major face, said body consisting of a material selected from the group consisting of the phosphides, arsenides and antimonides of boron, aluminum, gallium and indium;

a P type base zone in said body immediately adjacent said major face, said zone being about 0.4 micron thick and containing a net excess of zinc atoms over N type impurity atoms, said excess being less than $5 \times 10^{17}$ zinc atoms per $cm.^3$ at said one major face;

a rectifying barrier between said P type zone and said N type body;

an N type emitter region in said body immediately adjacent said one face, said N type region being completely surrounded by said P type zone, the concentration of donor atoms in said emitter region being about $1 \times 10^{19}$ atoms per $cm.^3$.

a rectifying barrier between said N type emitter region and said P type base zone;

a metallic contact to said N type emitter region;

a metallic contact to said P type base zone; and, electrical connections to said contacts.

2. A transistor as in claim 1, wherein said body consists of gallium arsenide.

References Cited by the Examiner

UNITED STATES PATENTS

| | | | |
|---|---|---|---|
| 3,060,327 | 10/1962 | Dacey | 307—88.5 |
| 3,131,096 | 4/1964 | Sommers | 418—33 |

OTHER REFERENCES

Semiconductors, edited by N. B. Hanney, copyright 1959 by Reingold Publishing Corp., N.Y., Patent Office Scientific Library #QC–612–S4H32–c.5., pages 405–09 containing article by J. M. Whelan, "Properties of Some Covalent Semiconductors."

S. W. Ing, Jr., and H. A. Jensen: "Light-Coupled Negative-Resistance Device in GaAs, from Proceedings of the IEEE, vol. 51, No. 5, May 1963, page 851.

JOHN W. HUCKERT, *Primary Examiner.*

A. M. LESNIAK, D. O. KRAFT, *Assistant Examiners.*